(12) United States Patent
Mizuta et al.

(10) Patent No.: US 6,939,431 B2
(45) Date of Patent: Sep. 6, 2005

(54) PASTE FOR CIRCUIT CONNECTION, ANISOTROPIC CONDUCTIVE PASTE AND USES THEREOF

(75) Inventors: Yasushi Mizuta, Chiba (JP); Tatsuji Murata, Chiba (JP); Makoto Nakahara, Osaka (JP); Takatoshi Kira, Osaka (JP); Daisuke Ikesugi, Osaka (JP)

(73) Assignees: Mitsui Chemicals, Inc., Tokyo (JP); Sharp Corporation, Osaka (JP)

( * ) Notice: Subject to any disclaimer, the term of this patent is extended or adjusted under 35 U.S.C. 154(b) by 65 days.

(21) Appl. No.: 10/307,282

(22) Filed: Dec. 2, 2002

(65) Prior Publication Data

US 2003/0144381 A1 Jul. 31, 2003

(30) Foreign Application Priority Data

Nov. 30, 2001 (JP) .................................... 2001-367579
Nov. 30, 2001 (JP) .................................... 2001-367580
Nov. 30, 2001 (JP) .................................... 2001-367581
Nov. 30, 2001 (JP) .................................... 2001-367582

(51) Int. Cl.$^7$ ......................... C09J 163/00; C08L 63/00
(52) U.S. Cl. ..................... 156/330; 156/155; 523/201; 523/434; 523/436; 523/437; 525/107; 525/108; 525/109; 525/113; 528/106
(58) Field of Search .............................. 156/155, 330; 523/201, 434, 436, 437; 525/107, 108, 109, 113; 528/106

(56) References Cited

U.S. PATENT DOCUMENTS 5,319,060 A * 6/1994 Nishikawa et al. ........... 528/89

6,555,187 B1 * 4/2003 Kitamura ................... 428/1.53
2001/0019382 A1 * 9/2001 Song et al. ................. 349/106

FOREIGN PATENT DOCUMENTS

| JP | 60-072957 A | 4/1985 |
| JP | 62-40183 A | 2/1987 |
| JP | 62-76215 A | 4/1987 |
| JP | 62-176139 A | 8/1987 |
| JP | 03-046707 A | 2/1991 |
| JP | 06-100667 A | 4/1994 |
| WO | WO 00/600055 A1 | 10/2000 |

OTHER PUBLICATIONS

English Abstract of JP 2000–284296, Ishibashi et al. Oct. 2000.*

* cited by examiner

*Primary Examiner*—Jeffrey B. Robertson
(74) *Attorney, Agent, or Firm*—Burns, Doane, Swecker & Mathis, LLP

(57) ABSTRACT

Pastes for circuit connections and anisotropic conductive pastes that are excellent in storage stability and dispenser application properties, can be free of voids, bubbles and bleeding on thermocompression bonding and can give cured products having high bonding and connection reliability at high temperatures and high humidity, and the ability to be repaired. The paste for circuit connection contains an epoxy resin, an acid anhydride curing agent or a phenolic curing agent, and high-softening point fine particles. The anisotropic conductive paste additionally contains conductive particles. The method of using the paste for circuit connection or the anisotropic conductive paste involves connecting an electric circuit wiring formed on a substrate with an electric circuit wiring formed on another substrate with the paste for circuit connection or the anisotropic conductive paste.

30 Claims, 1 Drawing Sheet

US 6,939,431 B2

PASTE FOR CIRCUIT CONNECTION, ANISOTROPIC CONDUCTIVE PASTE AND USES THEREOF

FIELD OF THE INVENTION

The present invention relates to pastes for circuit connection and anisotropic conductive pastes usable in connecting microscopic wirings of electric circuits for flat panel displays, such as liquid crystal displays, electroluminescence displays and plasma displays, charge coupled devices (CCD) and semiconductor devices, such as complementary metal-oxide semiconductors (CMOS). The present invention also relates to methods of using the paste for circuit connection or the anisotropic conductive paste in connection of electric circuit wirings.

BACKGROUND OF THE INVENTION

Recently, liquid crystal displays for television receivers, personal computers and cell phones are trending toward fineness and miniaturization, with which the wirings in driver integrated circuits are provided at narrower pitches. To assure high productivity, wirings of a tape carrier package (TCP) with integrated circuits mounted thereon and of a liquid crystal display substrate are connected under such severe thermocompression bonding conditions as a temperature of 200° C., a pressure of 2 MPa and a time of 10 to 30 seconds.

In such connection of the wirings, anisotropic conductive films, such as one disclosed in JP-A-3(1991)/46707, that comprise conductive fine particles dispersed in a resin to allow for anisotropy, are of conventional use. The anisotropic conductive films, however, have cost problems: the production cost is high because the film production involves a separator film, making the anisotropic conductive films expensive, and a dedicated automatic peeling machine needs to be provided to apply the films. Also the anisotropic conductive films cannot exhibit sufficient bond strength and suffers a lowering in connection reliability under hot and humid conditions.

Materials for solving the problems include pastes for circuit connection, anisotropic conductive pastes and anisotropic conductive adhesives that are liquid at room temperature, as disclosed in JP-A-62 (1987)/40183, JP-A-62(1987)/76215 and JP-A-62(1987)/176139. However, these pastes for circuit connection, anisotropic conductive pastes and anisotropic conductive adhesives drastically decrease its viscosity on thermocompression bonding process with a sharp rise in temperature. As a result voids and bleeding contamination occur due to the liquid flow at the time of thermocompression bonding. Conductive particles, present in the pastes for circuit connection, anisotropic conductive pastes and anisotropic conductive adhesives, partly agglomerate to cause conductive failure in the direction of compression. Moreover, after the pastes for circuit connection, the anisotropic conductive pastes, etc. are cured, the connection reliability thereof cannot be held at high temperatures and high humidity because of the bubbles remaining in the cured products. Also, the cured products, although high in strength, have no repairability.

Thus, materials that can be free of bubbles and have high bonding reliability, connection reliability and repairability when cured under such severe thermocompression bonding conditions as a temperature of 200° C., a pressure of 2 MPa and a time of 10 to 30 seconds, are desired.

OBJECT OF THE INVENTION

It is an object of the present invention to provide pastes for circuit connection and anisotropic conductive pastes that are excellent in storage stability and dispenser application properties, can be free of voids, bubbles and bleeding at thermocompression bonding and can be cured while assuring high bonding and connection reliabilities at high temperatures and high humidity and with reparability. It is another object of the invention to provide methods of using these pastes.

SUMMARY OF THE INVENTION

The paste for circuit connection of the present invention comprises:

(I) 30 to 80% by mass of an epoxy resin, (II) 10 to 50% by mass of a curing agent selected from an acid anhydride curing agent (IIA) and a phenolic curing agent (IIB), and (III) 5 to 25% by mass of high-softening point fine particles.

The paste for circuit connection of the invention comprises:

(I) 30 to 79.9% by mass of an epoxy resin, (II) 10 to 50% by mass of a curing agent selected from an acid anhydride curing agent (IIA) and a phenolic curing agent (IIB), (III) 5 to 25% by mass of high-softening point fine particles, and (V) 0.1 to 20% by mass of an anti-foaming agent.

The paste for circuit connection of the invention comprises:

(I) 30 to 79.8% by mass of an epoxy resin, (II) 10 to 50% by mass of a curing agent selected from an acid anhydride curing agent (IIA) and a phenolic curing agent (IIB)

(III) 5 to 25% by mass of high-softening point fine particles, and (VI) 0.1 to 5% by mass of a coupling agent.

The paste for circuit connection of the invention comprises:

(I) 30 to 79.8% by mass of an epoxy resin, (II) 10 to 50% by mass of a curing agent selected from an acid anhydride curing agent (IIA) and a phenolic curing agent (IIB), (III) 5 to 25% by mass of high-softening point fine particles, (V) 0.1 to 20% by mass of an anti-foaming agent, and (VI) 0.1 to 5% by mass of a coupling agent.

The anisotropic conductive paste of the present invention comprises:

(I) 30 to 80% by mass of an epoxy resin, (II) 10 to 50% by mass of a curing agent selected from an acid anhydride curing agent (IIA) and a phenolic curing agent (IIB), (III) 5 to 25% by mass of high-softening point fine particles, and (IV) 0.1 to 25% by mass of conductive particles.

The anisotropic conductive paste of the invention comprises:

(I) 30 to 79.9% by mass of an epoxy resin, (II) 10 to 50% by mass of a curing agent selected from an acid anhydride curing agent (IIA) and a phenolic curing agent (IIB), (III) 5 to 25% by mass of high-softening point fine particles, (IV) 0.1 to 25% by mass of conductive particles, and (V) 0.1 to 20% by mass of an anti-foaming agent.

The anisotropic conductive paste of the invention comprises:

(I) 30 to 79.8% by mass of an epoxy resin, (II) 10 to 50% by mass of a curing agent selected from an acid anhydride curing agent (IIA) and a phenolic curing agent (IIB), (III) 5 to 25% by mass of high-softening point fine particles, (IV) 0.1 to 25% by mass of conductive particles, and (VI) 0.1 to 5% by mass of a coupling agent.

The anisotropic conductive paste of the invention comprises:

(I) 30 to 79.8% by mass of an epoxy resin, (II) 10 to 50% by mass of a curing agent selected from an acid anhydride curing agent (IIA) and a phenolic curing agent (IIB)

(III) 5 to 25% by mass of high-softening point fine particles, (IV) 0.1 to 25% by mass of conductive particles, (V) 0.1 to 20% by mass of an anti-foaming agent, and (VI) 0.1 to 5% by mass of a coupling agent.

The pastes for circuit connection and the anisotropic conductive pastes may further comprise a curing catalyst (VII).

Preferably, the epoxy resin (I) has at least 1 to 6 epoxy groups on average per molecule and an average molecular weight of 100 to 7000 in terms of polystyrene according to GPC.

The acid anhydride curing agent (IIA) is preferably a phthalic acid or maleic acid derivative.

The phenolic curing agent (IIB) is preferably a phenolic novolak curing agent.

The high-softening point fine particles (III) preferably have a softening temperature of 60 to 150° C. and a primary particle size of 0.01 to 2 μm, and more preferably are obtained by copolymerization of methyl(meth)acrylate and copolymerizable monomer other than methyl(meth)acrylate and contain the methyl(meth)acrylate at 30 to 70% by mass.

The surface of the conductive particles (IV) preferably comprises gold or nickel.

The anti-foaming agent (V) is preferably a polysilicone, which is a silicone-modified elastomer having a softening temperature of −80 to 0° C. and existing in the pastes for circuit connection or the anisotropic conductive pastes as particles with a primary particle size of 0.05 to 5 μm. The silicone-modified elastomer is a elastomer desirably obtained by grafting a silicone-containing group to an epoxy resin.

The pastes for circuit connection or the anisotropic conductive pastes preferably have a viscosity at 25° C. of 30 to 400 Pa·s.

The method of using the paste for circuit connection or the anisotropic conductive paste comprises connecting an electric circuit wiring formed on a substrate with an electric circuit wiring formed on another substrate by means of the paste for circuit connection or the anisotropic conductive paste.

According to the present invention, the wirings can be securely connected with each other by the use of the paste for circuit connection or the anisotropic conductive paste capable of high bonding and connection reliabilities even at high temperatures and high humidity.

The method of using the paste for circuit connection or the anisotropic conductive paste can be applied to any one kind of circuit materials, liquid crystal displays, organic electroluminescence displays, plasma displays, charge coupled devices and semiconductor devices.

According to the present invention, the pastes for circuit connection and the anisotropic conductive pastes that are excellent in storage stability and dispenser application properties, can be free of voids, bubbles and bleeding at thermocompression bonding and can be cured while assuring high bonding and connection reliabilities at high temperatures and high humidity and with repairability, can be obtained. By using the pastes for circuit connection or the anisotropic conductive pastes of the invention, short-circuit in wirings is not caused and insulating properties between the neighboring wirings can be maintained.

DETAILED DESCRIPTION OF THE INVENTION

Figure 1:
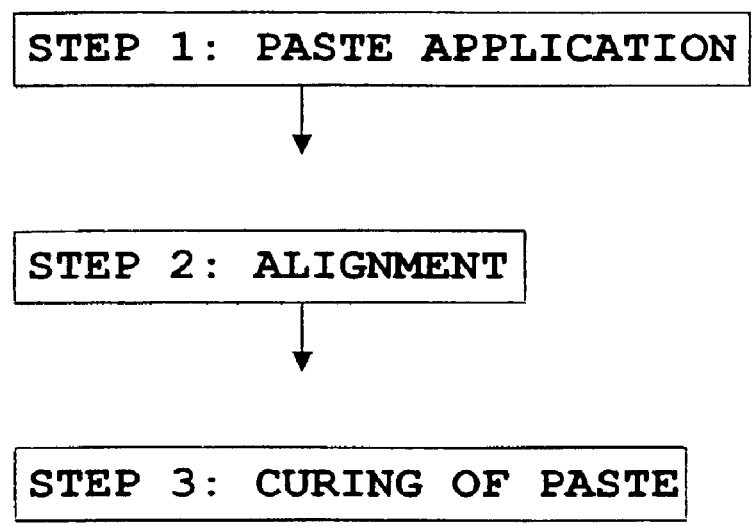
FIG. 1 is a schematic flow sheet of the process of connecting electric circuit wirings according to the present invention.

The following are detailed descriptions of the present invention.

The pastes for circuit connection of the invention are resin compositions described below. In the invention, the following resin compositions 1 to 4 all together are the pastes (resin compositions) for circuit connection.

The anisotropic conductive pastes of the invention are resin compositions described below. In the invention, the following resin compositions 5 to 8 all together are the anisotropic conductive pastes (resin compositions).

The first paste for circuit connection of the present invention comprises (I) 30 to 80% by mass of the epoxy resin, (II) 10 to 50% by mass of the curing agent selected from the acid anhydride curing agent (IIA) and the phenolic curing agent (IIB), and (III) 5 to 25% by mass of the high-softening point fine particles (hereinafter the resin composition 1).

The second paste for circuit connection of the invention comprises (I) 30 to 79.9% by mass of the epoxy resin, (II) 10 to 50% by mass of the curing agent selected from the acid anhydride curing agent (IIA) and the phenolic curing agent (IIB), (III) 5 to 25% by mass of the high-softening point fine particles, and (V) 0.1 to 20% by mass of the anti-foaming agent (hereinafter the resin composition 2).

The third paste for circuit connection of the invention comprises (I) 30 to 79.8% by mass of the epoxy resin, (II) 10 to 50% by mass of the curing agent selected from the acid anhydride curing agent (IIA) and the phenolic curing agent (IIB), (III) 5 to 25% by mass of the high-softening point fine particles, and (VI) 0.1 to 5% by mass of the coupling agent (hereinafter the resin composition 3).

The fourth paste for circuit connection of the invention comprises (I) 30 to 79.8% by mass of the epoxy resin, (II) 10 to 50% by mass of the curing agent selected from the acid anhydride curing agent (IIA) and the phenolic curing agent (IIB), (III) 5 to 25% by mass of the high-softening point fine particles, (V) 0.1 to 20% by mass of the anti-foaming agent, and (VI) 0.1 to 5% by mass of the coupling agent (hereinafter the resin composition 4).

The first anisotropic conductive paste of the present invention comprises (I) 30 to 80% by mass of the epoxy resin, (II) 10 to 50% by mass of the curing agent selected from the acid anhydride curing agent (IIA) and the phenolic curing agent (IIB), (III) 5 to 25% by mass of the high-softening point fine particles, and (IV) 0.1 to 25% by mass of the conductive particles (hereinafter the resin composition 5).

The second anisotropic conductive paste of the invention comprises (I) 30 to 79.9% by mass of the epoxy resin, (II) 10 to 50% by mass of the curing agent selected from the acid anhydride curing agent (IIA) and the phenolic curing agent (IIB), (III) 5 to 25% by mass of the high-softening point fine particles, (IV) 0.1 to 25% by mass of the conductive particles, and (V) 0.1 to 20% by mass of the anti-foaming agent (hereinafter the resin composition 6).

The third anisotropic conductive paste of the invention comprises (I) 30 to 79.8% by mass of the epoxy resin, (II) 10 to 50% by mass of the curing agent selected from the acid anhydride curing agent (IIA) and the phenolic curing agent (IIB), (III) 5 to 25% by mass of the high-softening point fine particles, (IV) 0.1 to 25% by mass of the conductive particles, and (VI) 0.1 to 5% by mass of the coupling agent (hereinafter the resin composition 7).

The fourth anisotropic conductive paste of the invention comprises (I) 30 to 79.8% by mass of the epoxy resin, (II) 10 to 50% by mass of the curing agent selected from the acid anhydride curing agent (IIA) and the phenolic curing agent (IIB), (III) 5 to 25% by mass of the high-softening point fine particles, (IV) 0.1 to 25% by mass of the conductive particles, (V) 0.1 to 20% by mass of the anti-foaming agent, and (VI) 0.1 to 5% by mass of the coupling agent (hereinafter the resin composition 8).

The resin compositions 1 to 8 may further comprise the curing catalyst (VII).

The above constitutions allow for obtainment of the pastes for circuit connection and the anisotropic conductive pastes that are excellent in storage stability and dispenser application properties and can be free of voids, bubbles and bleeding at thermocompression bonding. The cured products thereof exhibit high bonding and connection reliabilities even at high temperatures and high humidity and have repairability. The pastes for circuit connection and the anisotropic conductive pastes have characteristics of electric conductivity in the direction of compression curing and insulating properties in other directions. The components (I) to (VII) are described in detail hereinafter.

Epoxy Resin (I)

The amount of the epoxy resin (I) is 30 to 80% by mass, preferably 40 to 70% by mass, more preferably 50 to 65% by mass desirably based on 100% by mass of the paste for circuit connection or the anisotropic conductive paste (resin compositions 1 to 8). When the resin composition contains the later-described anti-foaming agent (V), the epoxy resin (I) is used at 30 to 79.9% by mass, preferably 40 to 69.9% by mass, more preferably 50 to 64.9% by mass desirably. When the resin composition contains the later-described coupling agent (VI), or the anti-foaming agent (V) and the coupling agent (VI) in combination, the epoxy resin (I) is used at 30 to 79.8% by mass, preferably 40 to 69.8% by mass, more preferably 50 to 64.8% by mass desirably.

When the epoxy resin (I) is used at 30% by mass or more based on the resin composition (100% by mass), the bonding and connection reliabilities can be ensured by the cured products of the pastes for circuit connection and the anisotropic conductive pastes, and at 80% by mass or less, the repairability can be ensured in the cured products of the pastes for circuit connection and the anisotropic conductive pastes. The repairability is a property to allow reuse of a substrate, i.e., the cured paste can be separated from the substrate, such as a glass substrate, without remaining when some troubles arise after electrodes are connected with each other with the paste for circuit connection or the anisotropic conductive paste and the bonded electrodes need to be released, washed and connected again.

The epoxy resin (I) for use in the invention is a conventional one, and desirably contains 1 to 6 epoxy groups on average, preferably 1.2 to 6 on average, more preferably 1.7 to 6 on average per molecule. When the epoxy resin (I) contains 1 to 6 epoxy groups on average per molecule, the pastes for circuit connection and the anisotropic conductive pastes may exhibit sufficient bonding and connection reliabilities at high temperatures and high humidity.

The epoxy resin (I) desirably has an average molecular weight of 100 to 7000, preferably 150 to 3000, more preferably 350 to 2000 in terms of polystyrene according to a gel permeation chromatography (hereinafter GPC). The above range of the average molecular weight in terms of polystyrene according to GPC is preferable because the pastes for circuit connection and the anisotropic conductive pastes can have excellent dispenser application properties. In the invention, the epoxy resin (I) may be any combination of epoxy resins, one with the above-range epoxy groups per molecule and the other with the above-range average molecular weight in terms of polystyrene.

The epoxy resin (I) may be liquid or solid at room temperature. Examples of the epoxy resin (I) include monofunctional epoxy resins (I-1) and polyfunctional epoxy resins (I-2), and use can be made of a combination of one or more resins selected from these resins.

Examples of the monofunctional epoxy resins (I-1) include aliphatic monoglycidyl ether compounds, aromatic monoglycidyl ether compounds, aliphatic monoglycidyl ester compounds, aromatic monoglycidyl ester compounds, alicyclic monoglycidyl ester compounds, nitrogen-containing monoglycidyl ether compounds, monoglycidyl propyl polysiloxane compounds and monoglycidyl alkanes.

The aliphatic monoglycidyl ether compounds include those obtained by reaction of a polyalkylene monoalkyl ether and epichlorohydrin and those obtained by reaction of an aliphatic alcohol and epichlorohydrin. The polyalkylene monoalkyl ether has an alkyl or alkenyl group of 1 to 6 carbon atoms, such as ethylene glycol monoalkyl ether, diethylene glycol monoalkyl ether, triethylene glycol monoalkyl ether, polyethylene glycol monoalkyl ether, propylene glycol monoalkyl ether, dipropylene glycol monoalkyl ether, tripropylene glycol monoalkyl ether and polypropylene glycol monoalkyl ether. Examples of the aliphatic alcohol include n-butanol, isobutanol, n-octanol, 2-ethylhexyl alcohol, dimethylol propane monoalkyl ether, methylol propane dialkyl ether, glycerin dialkyl ether, dimethylol propane monoalkyl ester, methylol propane dialkyl ester and glycerin dialkyl ester.

The aromatic monoglycidyl ether compounds include those obtained by reaction of an aromatic alcohol or an aromatic alcohol modified with an alkylene glycol, such as ethylene glycol or propylene glycol, with epichlorohydrin. Examples of the aromatic alcohol include phenol, benzyl alcohol, xylenol and naphthol.

The aliphatic monoglycidyl ester compounds include those obtained by reaction of an aliphatic monoalkyl dicarboxylate and epichlorohydrin, and the aromatic monoglycidyl ester compounds include those obtained by reaction of an aromatic monoalkyl dicarboxylate and epichlorohydrin.

Examples of the polyfunctional epoxy resins (I-2) include aliphatic polyvalent glycidyl ether compounds, aromatic polyvalent glycidyl ether compounds, aliphatic polyvalent glycidyl ester compounds, aromatic polyvalent glycidyl ester compounds, aliphatic polyvalent glycidyl ether ester compounds, aromatic polyvalent glycidyl ether ester compounds, alicyclic polyvalent glycidyl ether compounds, aliphatic polyvalent glycidyl amine compounds, aromatic polyvalent glycidyl amine compounds, hydantoin polyvalent glycidyl compounds, novolak polyvalent glycidyl ether compounds, epoxidized diene polymers, 3,4-epoxy-6-methylcyclohexylmethyl, 3,4-epoxy-6-methylcyclohexane carbonate and bis(2,3-epoxycyclopentyl)ethers.

The aliphatic polyvalent glycidyl ether compounds include those obtained by reaction of a polyalkylene glycol and epichlorohydrin and those obtained by a polyvalent alcohol and epichlorohydrin. Examples of the polyalkylene glycol include ethylene glycol, diethylene glycol, triethylene glycol, polyethylene glycol, propylene glycol, dipropylene glycol, tripropylene glycol and polypropylene glycol. Examples of the polyvalent alcohol include dimethylolpropane, trimethylolpropane, spiroglycol and glycerin.

The aromatic polyvalent glycidyl ether compounds include those obtained by reaction of an aromatic diol or an aromatic diol modified with an alkylene glycol, such as ethylene glycol or propylene glycol, with epichlorohydrin. Examples of the aromatic diol include bisphenol A, bisphenol S, bisphenol F and bisphenol AD.

The aliphatic polyvalent glycidyl ester compounds include those obtained by reaction of an aliphatic dicarboxylic acid, such as adipic acid or itaconic acid, with epichlorohydrin.

The aromatic polyvalent glycidyl ester compounds include those obtained by reaction of an aromatic dicarboxylic acid, such as isophthalic acid, terephthalic acid or pyromellitic acid, with epichlorohydrin.

The aliphatic polyvalent glycidyl ether ester compounds and the aromatic polyvalent glycidyl ether ester compounds include those obtained by reaction of a hydroxydicarboxylic acid compound and epichlorohydrin.

The aliphatic polyvalent glycidyl amine compounds include those obtained by reaction of an aliphatic diamine, such as polyethylene diamine, with epichlorohydrin.

The aromatic polyvalent glycidyl amine compounds include those obtained by reaction of an aromatic diamine, such as diaminodiphenylmethane, aniline or metaxylylenediamine, with epichlorohydrin.

The hydantoin polyvalent glycidyl compounds include those obtained by reaction of hydantoin or a derivative thereof with epichlorohydrin.

The novolak polyvalent glycidyl ether compounds include those obtained by reaction of a novolak resin derived from either phenol or cresol and formaldehyde with epichlorohydrin, and those obtained by reaction of a polyphenol, such as polyalkenyl phenol or a copolymer thereof, with epichlorohydrin.

The epoxidized diene polymers include epoxidized polybutadienes and epoxidized polyisoprenes.

Curing Agent (II)
Acid Anhydride Curing Agent (IIA)

The amount of the acid anhydride curing agent (IIA) is 10 to 50% by mass, preferably 10 to 40% by mass, more preferably 10 to 30% by mass desirably based on 100% by mass of the paste for circuit connection or the anisotropic conductive paste (resin compositions 1 to 8). When the acid anhydride curing agent (IIA) is used at 10% by mass or more based on the resin composition (100% by mass), the cured product of the resin composition will have excellent bonding and connection reliabilities at high temperatures and high humidity, and at 50% by mass or less, the viscosity of the resin composition can be prevented from rising, thereby realizing excellent workability and application properties.

The acid anhydride curing agent (IIA) may be liquid or solid at room temperature. For excellent workability and application properties, the liquid curing agent is preferable to use.

The acid anhydride curing agent (IIA) for use in the invention may be a conventional one, such as phthalic anhydride, maleic anhydride, tetrahydrophthalic anhydride, hexahydrophthalic anhydride, 4-methyltetrahydrophthalic anhydride, himic anhydride, HET anhydride, tetrabromophthalic anhydride, trimellitic anhydride, pyromellitic anhydride and benzophenonetetracarboxylic anhydride. Of these, the acid anhydrides derived from phthalic acid or maleic acid are preferable to use. These acid anhydride curing agents (IIA) may be used individually or in combination.

Phenolic Curing Agent (IIB)

The amount of the phenolic curing agent (IIB) is 10 to 50% by mass, preferably 10 to 40% by mass, more preferably 10 to 30% by mass desirably based on 100% by mass of the paste for circuit connection or the anisotropic conductive paste (resin compositions 1 to 8). When the phenolic curing agent (IIB) is used at 10% by mass or more based on the resin composition (100% by mass), the cured product of the resin composition will have excellent bonding and connection reliabilities at high temperatures and high humidity, and at 50% by mass or less, the viscosity of the resin composition can be prevented from rising, thereby realizing excellent workability and application properties.

The phenolic curing agent (IIB) may be liquid or solid at room temperature, and use can be made of phenolic curing agents with at least two functional groups individually or in combination. As the phenolic curing agent (IIB), the phenolic curing agent disclosed in JP-A-6(1994)/100667 can be used. Specific examples include condensates of a phenyl compound or a naphthalene compound with an aldehyde, a ketone, an aromatic compound or an alicyclic compound. Examples of the phenyl compound include phenol, cresol, ethylphenol and propylphenol. Examples of the naphthalene compound include α-naphthol and β-naphthol. Examples of the aldehyde include formaldehyde (formalin) and paraformaldehyde. Examples of the ketone include acetone and acetophenone. Examples of the aromatic compound include xylylene and divinylbenzene. Examples of the alicyclic compound include dicyclopentadiene.

The phenolic curing agent (IIB) can be a conventional one, preferably a phenolic novolak curing agent derived from either phenol or cresol and formaldehyde.

High-Softening Point Fine Particles (III)

Molten in the resin composition at its softening temperature or above, the high-softening point fine particles (III) used in the pastes for circuit connection and the anisotropic conductive pastes (resin compositions 1 to 8) can increase the paste viscosity to control its fluidity and can impart the repairability to the pastes for circuit connection and the anisotropic conductive pastes.

The amount of the high-softening point fine particles (III) is 5 to 25% by mass, preferably 10 to 20% by mass, more preferably 13 to 18% by mass desirably based on the resin composition (100% by mass). When the high-softening point fine particles (III) are used at 5% by mass or more based on the resin composition (100% by mass), occurrence of voids and bleeding at thermocompression bonding can be inhibited, and at 25% by mass or less, the viscosity of the paste for circuit connection or the anisotropic conductive paste does not increase to the extent hindering the application work, thereby realizing excellent workability, such as dispenser application properties.

The high-softening point fine particles (III) can be conventional ones having a softening temperature of 60 to 150° C., preferably 70 to 120° C. and a primary particle size of 0.01 to 2 $\mu$m, preferably 0.1 to 1 $\mu$m. In the invention, the high-softening point fine particles (III) may be any combination of fine particles, one with the above-range softening temperature and the other with the above-range primary particle size. The primary particle size means a size of particles, which are no longer able to be mechanically separated. The softening temperature is preferably 60° C. or above, because that temperature allows for excellent storage stability at room temperature of the pastes for circuit connection and the anisotropic conductive pastes. When the softening temperature is 150° C. or below, the flow of the pastes for circuit connection and the anisotropic conductive pastes can be suppressed in the thermocompression bonding process at 150 to 200° C., and also the repairability can be imparted. The primary particle size of the high-softening point fine particles (III) is preferably 0.01 to 2 $\mu$m in view of workability, such as dispenser application properties, and connection reliability.

The high-softening point fine particles (III) can be produced by preparing an emulsion solution of the high-softening point fine particles (III) and spray drying the solution. The emulsion solution can be obtained by copolymerizing a monomer, e.g., methyl (meth)acrylate, in an amount of 30 to 70% by mass with 70 to 30% by mass of other copolymerizable monomer. The copolymerizable monomer used herein is preferably a polyfunctional monomer. By use of the polyfunctional monomer, a slightly-crosslinked structure can be formed in the emulsion fine particles.

When the high-softening point fine particles (III), obtained from the emulsion solution, are used in the pastes for circuit connection and the anisotropic conductive pastes, the room-temperature storage stability of the pastes for circuit connection and the anisotropic conductive pastes can be further improved and occurrence of the voids and bleeding caused by thermocompression bonding can be further inhibited.

Examples of the monomer include acrylic esters, such as methyl (meth)acrylate, ethyl (meth)acrylate, propyl (meth)acrylate, butyl (meth)acrylate, 2-ethylhexyl (meth)acrylate, amyl (meth)acrylate, hexadecyl (meth)acrylate, octadecyl (meth)acrylate, butoxyethyl (meth)acrylate, phenoxyethyl (meth)acrylate, 2-hydroxyethyl (meth)acrylate and glycidyl (meth)acrylate; acrylic amides; acid monomers, such as those of (meth)acrylic acid, itaconic acid and maleic acid; and aromatic vinyl compounds, such as styrene and styrene-derivatives.

Examples of the polyfunctional monomer for formation of the slightly-crosslinked structure in the emulsion fine particles include divinylbenzene, diacrylates and conjugated dienes, such as 1,3-butadiene, 1,3-pentadiene, isoprene, 1,3-hexadiene and chloroprene.

Exemplary methods for slightly crosslinking the emulsion fine particles at their surfaces include the ionomer crosslinking by metal crosslinking epoxy groups, carboxyl groups and amino groups of the surface layers of the emulsion fine particles. With the slightly-crosslinked structure in the emulsion fine particles formed as above, the fine particles become less soluble in the epoxy resin (I), or a solvent, etc, at room temperature and the storage stability of the pastes for circuit connection and the anisotropic conductive pastes can be enhanced.

Conductive Particles (IV)

The amount of the conductive particles (IV) used in the anisotropic conductive pastes (resin compositions 5 to 8) is 0.1 to 25% by mass, preferably 1 to 20% by mass, more preferably 2 to 15% by mass desirably based on the resin composition (100% by mass). When the conductive particles (IV) are used at between 0.1 and 25% by mass based on the resin composition (100% by mass), sufficient conductivity can be imparted to the anisotropic conductive pastes.

The conductive particles (IV) used in the anisotropic conductive pastes can be conventional ones. Specific examples include conductive particles of noble metals, such as gold, nickel, silver and platinum; conductive particles of noble metal alloys, such as silver-copper alloy, gold-copper alloy and nickel alloy; and conductive particles obtained by coating organic polymer fine particles, such as polystyrene fine particles, with the above-mentioned noble metals and noble metal alloys. Preferable are the conductive noble-metal particles of gold or nickel, and the organic polymer fine particles coated with a noble-metal coating of gold or nickel. That the organic polymer fine particles are coated with a noble-metal coating of gold or nickel means the surface of the organic polymer fine particles comprises gold or nickel. Commercially available products include Micropearl AU™ series of Sekisui Fine Chemicals Division, Sekisui Chemical Co., Ltd. The conductive particles preferably range from 2 to 20 $\mu$m in particle size.

Anti-Foaming Agent (V)

The anti-foaming agent (V) used in the pastes for circuit connection and the anisotropic conductive pastes (resin compositions 2, 4, 6 and 8) can be a conventional one. Specifically, silicone anti-foaming agents and fluorine anti-foaming agents can be exemplified. The silicone anti-foaming agents are preferably used, and polysilicones are more preferable.

The amount of the anti-foaming agent (V) is 0.1 to 20% by mass, preferably 0.1 to 15% by mass, more preferably 0.5 to 15% by mass desirably based on the resin composition (100% by mass). When the anti-foaming agent (V) is used at 0.1% by mass or more in the resin composition (100% by mass), the pastes for circuit connection and the anisotropic conductive pastes hardly suffer from bubble generation and contain no bubbles after cured, and at 20% by mass or less, the pastes for circuit connection and the anisotropic conductive pastes will have excellent dispenser application properties and adhesion, and a decrease in gas-barrier properties after the curing can be suppressed.

The polysilicone is preferably a silicone-modified elastomer. The cured products of the pastes for circuit connection and the anisotropic conductive pastes can be more resistant to external physical impacts and thermal strains in a thermal shock test when the polysilicone is an elastomer. The external physical impacts and thermal strains in a thermal shock test can be even more moderated when the polysilicone is the silicone-modified elastomer. The silicone-modification means a graft bonding of a functional-group-containing silicone to the elastomer.

The polysilicone is preferably a silicone-modified elastomer prepared by grafting a silicone-containing group to an epoxy resin that is different from the epoxy resin (I) of the component for the pastes for circuit connection or the anisotropic conductive pastes. Generally the epoxy resins and silicones have a low compatibility with each other to readily cause a phase separation. Thus, the silicone-modified elastomer comprising the grafted epoxy resin is used as the polysilicone so that the polysilicone can be uniformly dispersed in the pastes for circuit connection and the anisotropic conductive pastes.

The polysilicone desirably has a softening temperature of −80 to 0° C., preferably −80 to −20° C., more preferably −80 to −40° C. With the softening temperature being in the above range, the effects of moderating external physical impacts and thermal strains in a thermal shock test can be improved, thereby ensuring a high bond strength.

The polysilicone is desirably fine particles of a rubber-like polymer with the primary particle size of 0.05 to 5 μm, preferably 0.1 to 3.5 μm, more preferably 0.1 to 2 μm. With the primary particle size of 0.05 μm or more, the polysilicone does not agglomerate in the pastes for circuit connection and the anisotropic conductive particles, and the viscosity of the pastes stabilizes to allow for excellent workability, such as dispenser application properties. With the polysilicone having the primary particle size of 5 μm or less, the pastes for circuit connection and the anisotropic conductive pastes containing the polysilicone will have excellent workability, such as dispenser application properties, and can ensure a high bond strength after cured. In the invention, the polysilicone may be any combination of polysilicones, one with the above-range softening temperature and the other with the above-range primary particle size.

Exemplary methods for preparing the polysilicone include a method using fine particles of a silicone rubber, the method disclosed in JP-A-60(1985)/72957, a method of introducing a double bond to an epoxy resin, reacting the double bond with a hydrogen-containing silicone reactable with the double bond, thereby generating a graft product, and polymerizing a silicone rubber monomer in the presence of the graft product, a method of introducing a double bond to an epoxy resin and reacting the double bond with a vinyl-group-containing silicone rubber monomer polymerizable with the double bond, thereby generating a graft product, and a method of polymerizing a silicone rubber monomer in the presence of the above graft product. Preferable are the method of generating the graft product and the method of generating the silicone rubber particles in the presence of the graft product without using the fine particles of a silicone rubber. The polysilicones obtained by these methods cause only a slight increase in viscosity when dispersed, so that good dispenser application properties can be obtained.

The silicone-modified elastomer in which the silicone-containing group is grafted to the epoxy resin, is desirably produced as follows: a silicone intermediate having a methoxy group in the molecule is added to react with a copolymer of an acrylic acid-residue-introduced epoxy resin and an acrylic ester compound, thereby generating a graft product of the modified epoxy resin and the silicone resin, and a two-pack cold-setting silicone rubber is added to the graft product.

More specifically, an acrylic acid or a methacrylic acid is added to an epoxy resin, such as bisphenol F, in an oxygen atmosphere, such as air, to produce a (meth)acrylic acid-residue-introduced epoxy resin having a double bond. The acrylic acid-residue-introduced epoxy resin is copolymerized with an acrylic ester compound, such as hydroxyethyl acrylate or butyl acrylate, in the presence of a radical polymerization initiator, such as azobisisobutyronitrile, to produce a copolymer. A silicone intermediate having a methoxy group in the molecule is added to react with the copolymer in the presence of a catalyst, such as dibutyltin laurate, thereby generating a graft product of the modified epoxy resin and the silicone resin by demethanolization. And a two-pack cold-setting silicone rubber is added to react with the graft product, thereby producing the silicone-modified elastomer in which the crosslinked fine particles of a silicone rubber are uniformly dispersed.

Coupling Agent (VI)

The coupling agent (VI) used in the pastes for circuit connection and the anisotropic conductive pastes (resin compositions 3, 4, 7 and 8) is employed to increase the adhesion between the resin composition and a substrate and to enhance the adhesion between the electric circuit wiring formed on a substrate and the electric circuit wiring formed on another substrate. Use thereof is made at 0.1 to 5% by mass, preferably 0.1 to 4% by mass, more preferably 0.1 to 3% by mass desirably based on the resin composition (100% by mass). When the coupling agent (VI) is used at 0.1% by mass or more based on the resin composition (100% by mass), the adhesion between the paste for circuit connection or the anisotropic conductive paste and a substrate is increased, and at 5% by mass or less, the cured paste will have a sufficient hardness, and staining to surrounding components can be lowered.

The coupling agent (VI) can be a conventional one. Specific examples include trialkoxysilane compounds and methyldialkoxysilane compounds. The trialkoxysilane compounds include γ-glycidoxypropyltrimethoxysilane, γ-glycidoxypropyltriethoxysilane, γ-aminopropyltrimethoxysilane, γ-aminopropyltriethoxysilane, N-aminoethyl-γ-iminopropyltrimethoxysilane, γ-mercaptopropyltrimethoxysilane and γ-isocyanatopropyltriethoxysilane. The methyldialkoxysilane compounds include γ-glycidoxypropylmethyldimethoxysilane, γ-glycidoxypropylmethyldiethoxysilane, γ-aminopropylmethyldimethoxysilane, γ-aminopropylmethyldiethoxysilane, N-aminoethyl-γ-iminopropylmethyldimethoxysilane, γ-mercaptopropylmethyldimethoxysilane and isocyanatopropylmethyldiethoxysilane.

Curing Catalyst (VII)

The curing catalyst (VII) used in the pastes for circuit connection and the anisotropic conductive pastes (resin compositions 1 to 8) works as a catalyst in the reaction of the epoxy resin (I) and the acid anhydride curing agent (IIA) or the phenolic curing agent (IIB), and specifically is added for the purpose of curing the resin composition in a very short time. The curing catalyst (VII) can be selected from among well-known epoxy curing catalysts. In particular, a latent epoxy curing catalyst that will activate thermosetting at a heating temperature of 40° C. or above is preferably used. The curing catalyst (VII) does not comprehend the acid anhydride curing agent (IIA) and the phenolic curing agent (IIB).

Examples of the latent curing catalyst that will activate thermosetting at a heating temperature of 40° C. or above include dicyandiamide, derivatives thereof and dihydrazide compounds, such as dihydrazide adipate and dihydrazide isophthalate. Also employable are derivatives of imidazole compounds and modified products thereof, i.e., imidazole curing catalysts. Examples of the imidazole curing catalysts include imidazole derivatives, such as 2-methylimidazole, 2-ethyl-4-methylimidazole and 2-n-pentadecylimidazole; imidazole-modified derivatives, such as complexes of imidazole compounds and aromatic acid anhydrides and adducts of imidazole compounds and epoxy resins; and microcapsuled modified products.

The microcapsuled modified products, in other words microcapsuled imidazole curing catalysts, include 2-methylimidazole, 2-ethyl-4-methylimidazole and 2-n-pentadecylimidazole that are encapsulated as a core material in a minute shell.

The curing catalyst (VII) is desirably used at 15% by mass or less, preferably 1 to 10% by mass based on 100% by mass of the resin composition (1–8). The amount of not more than 15% by mass develops characteristics of the cured epoxy resin so that high bonding reliability can be obtained.

In the case where the curing catalyst (VII) alone is used in the pastes for circuit connection and the anisotropic conductive pastes while the acid anhydride curing agent (IIA) or the phenolic curing catalyst (IIB) is not used, the resin composition will be cured by ionic polymerization of the epoxy resin (I) but can be less sufficient in properties than a cured product with the use of the acid anhydride curing agent (IIA) or the phenolic curing agent (IIB).

Other Additive

Other additive, such as an inorganic filler and a solvent, may be added to the pastes for circuit connection and the anisotropic conductive pastes (resin compositions 1 to 8).

The inorganic filler is added for the purposes of viscosity control and reduction in thermal stress of the cured product, and can be selected from among well-known inorganic compounds. Examples of the inorganic filler include calcium carbonate, magnesium carbonate, barium sulfate, magnesium sulfate, aluminum silicate, zirconium silicate, iron oxide, titanium oxide, aluminum oxide (alumina), zinc oxide, silicon dioxide, potassium titanate, kaolins, talcs, powdered asbestos, powdered quartz, mica and glass fibers.

The particle size of the inorganic filler is desirably 2 $\mu$m or less, preferably 0.01 to 1 $\mu$m but is not limited thereto if it is not influential to the conductivity of the pastes for circuit connection and the anisotropic conductive pastes. The inorganic filler is desirably used at 40% by mass or less, preferably 5 to 30% by mass based on the resin composition (100% by mass), but the amount is not particularly limited thereto if it is not influential to the conductivity of the pastes for circuit connection and the anisotropic conductive pastes.

The inorganic filler is preferably graft modified partially or entirely with the epoxy resin (I) and/or the coupling agent (VI) in an amount of 1 to 50% by mass based on the inorganic filler (100% by mass). That is, the inorganic filler for use in the invention preferably has a graft percentage, represented by a weight increase determined by repetitive solvent cleaning, of 1 to 50%.

The repetitive solvent cleaning for obtaining the graft percentage is carried out as follows. The inorganic filler that has been partially or entirely graft modified is wetted and filtered 5 to 10 times with a 10 to 20-fold mass of the following solvent. By this filtration, the epoxy resin (I) and the coupling agent (VI) that are not involved in the graft modification are washed away. Examples of the solvent include good solvents for the epoxy resin (I) and the coupling agent (VI), such as acetone, methyl ethyl ketone, methanol, ethanol, toluene and xylene. After the filtration, the remaining inorganic filler is dried and weighed. The obtained value is a dry mass of the graft-modified inorganic filler. The measured value is applied to the following formula to obtain the weight increase. Apart from the repetitive solvent cleaning, the graft percentage can also be obtained by continuous Soxhiet extraction using the above-mentioned solvent.

[Formula]

Graft Percentage (%): [(dry mass of inorganic filler after graft modification–dry mass of inorganic filler before graft modification)/dry mass of inorganic filler before graft modification]× 100.

Specific examples of the solvent include ketone solvents, such as methyl ethyl ketone, methyl isobutyl ketone and cyclohexanone; ether solvents, such as diethyleneglycol dimethylether, methylcarbitol, ethylcarbitol and butylcarbitol; ethyl acetate, diethyleneglycol diacetate and alkoxy diethyleneglycol monoacetate. The amount of the solvent is not particularly limited, and the solvent is used in amounts not remaining therein after the pastes for circuit connection and the anisotropic conductive pastes are cured.

Preparation of the pastes for circuit connection and the anisotropic conductive pastes of the invention is not particularly limited, and the following is one example. The above mentioned epoxy resin (I), curing agent (II), high-softening point fine particles (III), anti-foaming agent (V) and coupling agent (VI) are pre-kneaded at room temperature with a Dalton's mixer and then kneaded with a three-roll mill. For preparation of the pastes for circuit connection, the curing catalyst (VII) is added to and mixed with the above mixture and the resulting mixture is kneaded and degassed under vacuum with a Dalton's mixer. For preparation of the anisotropic conductive pastes, the conductive particles (IV) and the curing catalyst (VII) are added to and mixed with the above mixture and the resulting mixture is kneaded and degassed under vacuum with a Dalton's mixer.

The thus-obtained pastes for circuit connection and the anisotropic conductive pastes desirably have a viscosity at 25° C. of 30 to 400 Pa·s, preferably 40 to 200 Pa·s, more preferably 50 to 150 Pa·s (EH-type viscometer, 2.5 rpm). With the paste viscosity of 30 Pa·s or more, the resin flow, which is a cause of bubble generation, at the curing by thermocompression bonding can be inhibited, and with 400 Pa·s or less, excellent dispenser application properties can be attained.

Use of the Pastes for Circuit Connection and the Anisotropic Conductive Pastes

Use of the pastes for circuit connection and the anisotropic conductive pastes is concerned with a connection of electric circuit wirings. Here the explanation will be on a process of connecting electric circuit wirings of a liquid crystal display.

As shown in FIG. 1, Step 1 comprises applying the paste for circuit connection or the anisotropic conductive paste by a dispenser on a predetermined area of a liquid crystal display substrate. In Step 2, the liquid crystal display substrate is aligned with TCP, an IC-mounted circuit substrate. In Step 3, the paste for circuit connection or the anisotropic conductive paste is cured by hot pressing in a fixed state. Through these Steps 1 to 3, an electrically conductive circuit is formed between the liquid crystal display substrate and the TCP.

In the dispenser application of the paste for circuit connection or the anisotropic conductive past of Step 1, the entire dispenser may have been pre-heated at 20 to 50° C.

The paste for circuit connection or the anisotropic conductive past can be applied with a computer control, such as in the dispenser application, or manually to appropriate areas.

In the curing of the paste for circuit connection or the anisotropic conductive paste by hot pressing in a fixed state of Step 3, a hot plate for the hot pressing is desirably temperature-controlled at 100 to 300° C., preferably 120 to 250° C. The compression pressure in hot pressing is 0.1 to 5 MPa, at which the electrodes joint is hot pressed equally. In the pressing, a rubber mat or the like may be interposed between the electrode and the press face.

By connecting in the above manner the wirings of the liquid crystal display substrate and of TCP with the paste for circuit connection or the anisotropic conductive paste of the invention, connection can be effected to allow conductivity only in the direction of thermocompression bonding. Accordingly, insulating properties between the neighboring wirings can be maintained and the wirings can be connected with high connection reliability.

Although the process of connecting electric circuit wirings has been described on a liquid crystal display, the process is also applicable to the connection of electric circuit wirings of other flat panel displays, such as organic electroluminescence displays and plasma displays. The pastes for circuit connection and the anisotropic conductive pastes can be used in connection of wirings of circuit materials, charge coupled devices (CCD) and semiconductor devices, such as CMOS.

EXAMPLE

The present invention will be illustrated in great detail by the following Examples, but it should be construed that the invention is not limited to the Examples.

Tests and measurements in the Examples and Comparative Examples were conducted by the following methods.

1. Test of Storage Stability

The viscosity at 25° C. of the paste for circuit connection or the anisotropic conductive paste was measured and used as a standard. The paste for circuit connection or the anisotropic conductive paste was put in a polyethylene container, and the container was closed and stored in a constant temperature bath at −10° C. Thirty days later, the viscosity at 25° C. was measured, and the storage stability was evaluated based on the viscosity increase.

AA: less than 10%

BB: 10% to less than 50%

CC: 50% or more

2. Test of Application Properties

The paste for circuit connection or the anisotropic conductive paste was filled into a 10-cc syringe and degassed. The paste was applied by a dispenser (SHOTMASTER by MUSASHI ENGINEERING, INC.) at a rate of 4 cm/sec, and the application properties were evaluated based on the following criteria.

AA: no bleeding, no stringing and good appearance

BB: no bleeding, no stringing but bad appearance

CC: bleeding and stringing due to remarkably inferior application properties

3. Gel Time Measurement

The paste for circuit connection or the anisotropic conductive paste in an amount of 1 g was placed on a hot plate of 150° C. and stirred with a spatula. The time was measured from the placement of the resin composition on the hot plate to the last stringing, thereby obtaining the gel time.

4. Bond Strength Measurement

With the paste for circuit connection or the anisotropic conductive paste in an amount of 1 g, drawing was made on a low-alkaline glass plate by means of a dispenser (SHOTMASTER by MUSASHI ENGINEERING, INC.). The glass plate was compressed against and laminated with a testing TAB (tape automated bonding) film with a pressure of 2 MPa by a ceramic tool of 230° C. for 30 seconds. After 24 hours of storage in a constant temperature oven at 25° C. and 50% RH (relative humidity), the peel strength (bond strength: g/cm) was measured by a tensile strength tester (produced by Intesco Corporation).

5. Confirmation of Void

With the paste for circuit connection or the anisotropic conductive paste in an amount of 1 g, drawing was made on a low-alkaline glass plate by means of a dispenser (SHOTMASTER by MUSASHI ENGINEERING, INC.). The glass plate was compressed against and laminated with a testing TAB film with a pressure of 2 MPa by a ceramic tool of 230° C. for 30 seconds. After cooling, the joint was observed with a microscope and evaluated based on the following criteria.

AA: no voids, no bleeding and good appearance

BB: some voids observed between bumps and bad appearance

CC: voids and bleeding generated in the whole joint

6. Confirmation of Bubbles Generation

The paste for circuit connection or the anisotropic conductive paste in an amount of 1 g was applied to a low-alkaline glass plate by means of a dispenser (SHOTMASTER by MUSASHI ENGINEERING, INC.). The glass plate was compressed against and laminated with a testing TAB film with a pressure of 2 MPa by a ceramic tool of 230° C. for 30 seconds. After cooling, the joint was observed with a microscope and evaluated based on the following criteria.

AA: no bubbles and good appearance

BB: some bubbles observed between bumps

CC: bubbles observed in the whole joint

7. Conductivity Measurement

The paste for circuit connection or the anisotropic conductive paste in an amount of 1 g was applied to a low-alkaline glass plate with an ITO (indium tin oxide) wiring by means of a dispenser (SHOTMASTER by MUSASHI ENGINEERING, INC.). The glass plate was compressed against and laminated with a testing TAB film with a pressure of 2 MPa by a ceramic tool of 230° C. for 30 seconds. Immediately after the lamination, the electrical resistance (Ω) between the ITO electrode and the electrode on the testing TAB film was measured, and after 600 hours of storage at 60° C. and 95% RH, the electrical resistance between the electrodes was measured again.

8. Test of Wiring Short-Circuit

With the paste for circuit connection or the anisotropic conductive paste in an amount of 1 g, drawing was made on a low-alkaline glass plate with an ITO wiring by means of a dispenser (SHOTMASTER by MUSASHI ENGINEERING, INC.). The glass plate was compressed against and laminated with a testing TAB film with a pressure of 2 MPa by a ceramic tool of 230° C. for 30 seconds. After cooling, the electrical conductivity between the neighboring ITO electrodes was checked and evaluated based on the following criteria.

AA: insulation ensured

BB: electrically conducted

9. Repairability Test

With the paste for circuit connection or the anisotropic conductive paste in an amount of 1 g, drawing was made on a low-alkaline glass plate by means of a dispenser (SHOTMASTER by MUSASHI ENGINEERING, INC.). The glass plate was compressed against and laminated with a testing TAB film with a pressure of 2 MPa by a ceramic tool of 230° C. for 30 seconds. After cooling, the laminate was washed with a solvent and the testing TAB film was peeled off. Then, the surface of the low-alkaline glass plate was observed with a microscope and evaluated based on the following criteria.

AA: no resin remaining and good appearance

BB: resin remaining partially and bad appearance

CC: resin remaining over the whole surface

Synthesis Example 1

Synthesis of High-softening Point Fine Particles

Ion exchange water, 400 g, was put in a 1000 ml four-neck flask equipped with an agitator, a nitrogen inlet, a thermometer and a reflux condenser. With agitation, 1.0 g of sodium alkyldiphenyletherdisulfonate was introduced to the flask, which was then heated to 65° C. While keeping the temperature at 65° C. and continuing the agitation, 0.4 g of potassium persulfate was added, followed by 4-hour continuous dropwise addition of a mixed solution which had been prepared by emulsifying a solution comprising 1.2 g of t-dodecylmercaptan, 156 g of n-butyl acrylate, 4.0 g of divinylbenzene, 3.0 g of sodium alkyldiphenyletherdisulfonate and 200 g of ion exchange water by means of a homogenizer. On completion of the dropwise addition, reaction was further carried out for 2 hours, and 232 g of methyl methacrylate was added all at once. After reaction was carried out for 1 hour, 8 g of acrylic acid was continuously added over a period of 1 hour and reaction was carried out for 2 hours at a constant temperature of 65° C., followed by cooling. The resulting solution was neutralized to pH=7 with potassium hydroxide, thereby obtaining an emulsion solution containing solids at 40.6% by mass.

The emulsion solution, 1000 g, was spray dried by a spray drier to give about 400 g of high-softening point fine particles with moisture contents of 0.1% or less. The high-softening point fine particles had a softening temperature of 80° C.

The particle size of the high-softening point fine particles was measured with a submicron particle analyzer (N4PLUS available from Beckman Coulter, Inc.) and found to be 180 nm.

Synthesis Example 2

Synthesis of Low-softening Point Fine Particles

Ion exchange water, 400 g, was put in a 1000 ml four-neck flask equipped with an agitator, a nitrogen inlet, a thermometer and a reflux condenser. With agitation, 1.0 g of sodium alkyldiphenyletherdisulfonate was introduced to the flask, which was then heated to 65° C. While keeping the temperature at 65° C. and continuing the agitation, 0.4 g of potassium persulfate was added, followed by 4-hour continuous dropwise addition of a mixed solution which had been prepared by emulsifying a solution comprising 1.2 g of t-dodecylmercaptan, 156 g of n-butyl acrylate, 4.0 g of divinylbenzene, 3.0 g of sodium alkyldiphenyletherdisulfonate and 200 g of ion exchange water by means of a homogenizer. On completion of the dropwise addition, reaction was further carried out for 2 hours, and 142 g of methyl methacrylate and 90 g of n-butyl acrylate were added all at once. After reaction was carried out for 1 hour, 8 g of acrylic acid was continuously added over a period of 1 hour and reaction was carried out for 2 hours at a constant temperature of 65° C., followed by cooling. The resulting solution was neutralized to pH=7 with potassium hydroxide, thereby obtaining an emulsion solution containing solids at 40.6% by mass.

The emulsion solution, 1000 g, was spray dried by a spray drier to give about 400 g of low-softening point fine particles with moisture contents of 0.1% or less. The low-softening point fine particles had a softening temperature of 40° C.

The particle size of the low-softening point fine particles was measured with the submicron particle analyzer used in Synthesis Example 1 and found to be 180 nm.

Synthesis Example 3

Synthesis of Silicone Elastomer (A)

Into a 2000 ml four-neck flask equipped with an agitator, a gas inlet, a thermometer and a condenser were added 600 g of a bisphenol F epoxy resin (EPICLON 830S produced by DAINIPPON INK AND CHEMICALS, INCORPORATED) having two epoxy groups in the molecule, 12 g of methacrylic acid, 1 g of dimethylethanolamine and 50 g of toluene. While introducing air, reaction was carried out for 5 hours at 110° C., thereby introducing double bonds in the molecule. Then, 5 g of hydroxy acrylate, 10 g of butyl acrylate and 1 g of azobisisobutyronitrile were added, and reaction was carried out for 3 hours at 70° C. and further for 1 hour at 90° C. Next, the toluene was removed under vacuum at 110° C. Then, 70 g of a silicone intermediate having a methoxy group in the molecule (Dow Corning Toray Silicone Co., Ltd.) and 0.3 g of dibutyltin dilaurate were added, and reaction was carried out for 1 hour at 150° C. To remove methanol generated, reaction was carried out for another 1 hour. To the resulting graft product, a one-to-one mixture of a cold-setting two-pack silicone rubber (KE-1204 produced by Shin-Etsu Silicones) was added in an amount of 300 g, and reaction was carried out for 2 hours, thereby obtaining a silicone elastomer (A) in which crosslinked silicone rubber fine particles were homogeneously dispersed.

The silicone elastomer (A) was rapidly cured in the presence of a photocuring catalyst at a low temperature. Morphologic features in a rupture cross-section of the cured product were observed with an electron microscope to measure the particle sizes of dispersed rubber particles. The average particle size of the rubber particles was 1.0 μm.

Example 1

At room temperature, the epoxy resin (I): a bisphenol A epoxy resin, the acid anhydride curing agent (IIA): a hydrogenated 4-methylphthalic anhydride (RIKACID MH-700 produced by New Japan Chemical Co., Ltd.), the high-softening point fine particles (III): the high-softening point fine particles synthesized in Synthesis Example 1, the anti-foaming agent (V): the silicone elastomer (A) synthesized in Synthesis Example 3, and the coupling agent (VI): γ-glycidoxypropyltrimethoxysilane (KBM-403 produced by Shin-Etsu Silicones), were pre-kneaded by means of a Dalton's mixer and then kneaded with a three-roll mill. After the curing catalyst (VII): an imidazole-modified microcapsuled compound (NOVACURE HX3748 produced by Asahi Kasei Epoxy Corporation) was mixed with the kneaded product, the mixture was kneaded with a Dalton's mixer under vacuum and degassed. Amounts of the components added are shown in Table 1.

The paste for circuit connection thus obtained was evaluated by the aforesaid testing methods. The results are shown in Table 2.

Example 2

A paste for circuit connection was prepared and evaluated in the same manner as in Example 1, except that the curing catalyst (VII) was not used and the other components were used in amounts as shown in Table 1. The results are shown in Table 2.

Example 3

A paste for circuit connection was prepared and evaluated in the same manner as in Example 1, except that the curing catalyst (VII) was not used, the anti-foaming agent (V) was changed from the silicone elastomer (A) to linear silicone B (DC3037 produced by Shin-Etsu Silicones), and the other components were used in amounts as shown in Table 1. The results are shown in Table 2.

Example 4

A paste for circuit connection was prepared and evaluated in the same manner as in Example 1, except that the anti-foaming agent (V) was not used and the other components were used in amounts as shown in Table 1. The results are shown in Table 2.

Example 5

A paste for circuit connection was prepared and evaluated in the same manner as in Example 1, except that the coupling agent (VI) was not used and the other components were used in amounts as shown in Table 1. The results are shown in Table 2.

Example 6

A paste for circuit connection was prepared and evaluated in the same manner as in Example 1, except that the coupling agent (VI) and the anti-foaming agent (V) were not used and the other components were used in amounts as shown in Table 1. The results are shown in Table 2.

Comparative Example 1

A paste for circuit connection was prepared and evaluated in the same manner as in Example 1, except that the high-softening point fine particles (III) were not used and the other components were used in amounts as shown in Table 1. The results are shown in Table 2.

Comparative Example 2

A paste for circuit connection was prepared and evaluated in the same manner as in Example 1, except that the high-softening point fine particles (III) were changed to the low-softening point fine particles synthesized in Synthesis Example 2 and the other components were used in amounts as shown in Table 1. The results are shown in Table 2.

As shown in Table 2, the pastes for circuit connection of Examples 1 to 6 were favorably evaluated by the tests.

TABLE 1

| Composition | Example | | | | | | Comparative Example | |
|---|---|---|---|---|---|---|---|---|
| (parts by weight) | 1 | 2 | 3 | 4 | 5 | 6 | 1 | 2 |
| (I) Epoxy resin | 58 | 60 | 60 | 60 | 58 | 60 | 63 | 57 |
| (IIA) Acid anhydride curing agent | 12 | 14 | 14 | 14 | 13 | 15 | 17 | 10 |
| (III) High-softening point fine particles | 15 | 15 | 15 | 21 | 15 | 21 | — | — |
| Low-softening point fine particles | — | — | — | — | — | — | — | 15 |
| (V) Anti-foaming agent | | | | | | | | |
| Silicone A | 10 | 10 | — | — | 10 | — | 15 | 13 |
| Silicone B | — | — | 10 | — | — | — | — | — |
| (VI) Coupling agent | 1 | 1 | 1 | 1 | — | — | 1 | 1 |
| (VII) Curing catalyst | 4 | — | — | 4 | 4 | 4 | 4 | 4 |
| Total | 100 | 100 | 100 | 100 | 100 | 100 | 100 | 100 |

Acid anhydride curing agent: RIKACID MH-700 (New Japan Chemical Co., Ltd.)

High-softening point fine particles: softening temperature= 80° C.

Low-softening point fine particles: softening temperature= 40° C.

Silicone A: silicone elastomer (A)

Silicone B: linear silicone DC3037 (Shin-Etsu Silicones)

Curing catalyst: imidazole-modified microcapsuled compound

TABLE 2

| Evaluation Item | Example | | | | | | Comparative Example | |
| --- | --- | --- | --- | --- | --- | --- | --- | --- |
|  | 1 | 2 | 3 | 4 | 5 | 6 | 1 | 2 |
| (1) Storage stability | AA | AA | AA | AA | AA | AA | AA | CC |
| (2) Application properties | AA | AA | AA | AA | AA | AA | AA | CC |
| (3) Gel time (sec) | 14 | 27 | 26 | 12 | 14 | 12 | 14 | 13 |
| (4) Bond strength (g/cm) | 1250 | 1150 | 910 | 930 | 830 | 870 | 560 | 470 |
| (5) Void | AA | AA | AA | AA | AA | AA | CC | BB |
| (6) Bubbles generation | AA | AA | AA | BB | AA | BB | BB | AA |
| (7) Electrical conductivity | | | | | | | | |
| immediately after lamination | 10 Ω | 10 Ω | 10 Ω | 10 Ω | 10 Ω | 10 Ω | 10 Ω | 16 Ω |
| after 600-hour storage at 60° C. and 95% RH | 10 Ω | 10 Ω | 11 Ω | 10 Ω | 10 Ω | 11 Ω | 17 Ω | 32 Ω |
| (8) Wiring short-circuit | AA | AA | AA | AA | AA | AA | AA | AA |
| (9) Repairability | AA | AA | AA | AA | AA | AA | CC | BB |

Example 7

At room temperature, the epoxy resin (I): a bisphenol A epoxy resin, the acid anhydride curing agent (IIA): a hydrogenated 4-methylphthalic anhydride (RIKACID MH-700 produced by New Japan Chemical Co., Ltd.), the high-softening point fine particles (III): the high-softening point fine particles synthesized in Synthesis Example 1, the anti-foaming agent (V): the silicone elastomer (A) synthesized in Synthesis Example 3, and the coupling agent (VI): γ-glycidoxypropyltrimethoxysilane (KBM-403 produced by Shin-Etsu Silicones), were pre-kneaded by means of a Dalton's mixer and then kneaded with a three-roll mill. After the conductive particles (IV): Micropearl Au-205 (produced by Sekisui Chemical Co., Ltd; specific gravity 2.67) and the curing catalyst (VII): an imidazole-modified microcapsuled compound (NOVACURE HX3748 produced by Asahi Kasei Epoxy Corporation) were mixed with the kneaded product, the mixture was kneaded with a Dalton's mixer under vacuum and degassed. Amounts of the components added are shown in Table 3.

The anisotropic conductive paste thus obtained was evaluated by the aforesaid testing methods. The results are shown in Table 4.

Example 8

An anisotropic conductive paste was prepared and evaluated in the same manner as in Example 7, except that the curing catalyst (VII) was not used and the other components were used in amounts as shown in Table 3. The results are shown in Table 4.

Example 9

An anisotropic conductive paste was prepared and evaluated in the same manner as in Example 7, except that the anti-foaming agent (V) was changed from the silicone elastomer (A) to linear silicone B (DC3037 produced by Shin-Etsu Silicones) and the other components were used in amounts as shown in Table 3. The results are shown in Table 4.

Example 10

An anisotropic conductive paste was prepared and evaluated in the same manner as in Example 7, except that the coupling agent (VI) was not used and the other components were used in amounts as shown in Table 3. The results are shown in Table 4.

Example 11

An anisotropic conductive paste was prepared and evaluated in the same manner as in Example 7, except that the coupling agent (VI) and the anti-foaming agent (V) were not used and the other components were used in amounts as shown in Table 3. The results are shown in Table 4.

Example 12

An anisotropic conductive paste was prepared and evaluated in the same manner as in Example 7, except that the coupling agent (VI), the anti-foaming agent (V) and the curing catalyst (VII) were not used and the other components were used in amounts as shown in Table 3. The results are shown in Table 4.

Comparative Example 3

An anisotropic conductive paste was prepared and evaluated in the same manner as in Example 7, except that the high-softening point fine particles (III) were not used and the other components were used in amounts as shown in Table 3. The results are shown in Table 4.

Comparative Example 4

An anisotropic conductive paste was prepared and evaluated in the same manner as in Example 7, except that the high-softening point fine particles (III) were changed to the low-softening point fine particles synthesized in Synthesis Example 2 and the other components were used in amounts as shown in Table 3. The results are shown in Table 4.

Comparative Example 5

An anisotropic conductive paste was prepared and evaluated in the same manner as in Example 7, except that the components were used in amounts as shown in Table 3. The results are shown in Table 4.

As shown in Table 4, the anisotropic conductive pastes of Examples 7 to 12 were favorably evaluated by the tests.

TABLE 3

| Composition (parts by weight) | Example | | | | | | Comparative Example | | |
|---|---|---|---|---|---|---|---|---|---|
| | 7 | 8 | 9 | 10 | 11 | 12 | 3 | 4 | 5 |
| (I) Epoxy resin | 49 | 52 | 49 | 50 | 53 | 55 | 55 | 49 | 27 |
| (IIA) Acid anhydride curing agent | 15 | 17 | 15 | 15 | 17 | 20 | 19 | 15 | 51 |
| (III) High-softening point fine particles | 15 | 15 | 15 | 15 | 20 | 20 | — | — | 8 |
| Low-softening point fine particles | — | — | — | — | — | — | — | 15 | — |
| (IV) Conductive particles | 5 | 5 | 5 | 5 | 5 | 5 | 5 | 5 | 5 |
| (V) Anti-foaming agent | | | | | | | | | |
| Silicone A | 10 | 10 | — | 10 | — | — | 15 | 10 | 3 |
| Silicone B | — | — | 10 | — | — | — | — | — | — |
| (VI) Coupling agent | 1 | 1 | 1 | — | — | — | 1 | 1 | 1 |
| (VII) Curing catalyst | 5 | — | 5 | 5 | 5 | — | 5 | 5 | 5 |
| Total | 100 | 100 | 100 | 100 | 100 | 100 | 100 | 100 | 100 |

Acid anhydride curing agent: RIKACID MH-700 (New Japan Chemical Co., Ltd.)
High-softening point fine particles: softening temperature= 80° C.
Low-softening point fine particles: softening temperature= 40° C.
Silicone A: silicone elastomer (A)
Silicone B: linear silicone DC3037 (Shin-Etsu Silicones)
Curing catalyst: imidazole-modified microcapsuled compound

TABLE 4

| Evaluation Item | Example | | | | | | Comparative Example | | |
|---|---|---|---|---|---|---|---|---|---|
| | 7 | 8 | 9 | 10 | 11 | 12 | 3 | 4 | 5 |
| (1) Storage stability | AA | AA | AA | AA | AA | AA | AA | CC | BB |
| (2) Application properties | AA | AA | AA | AA | AA | AA | AA | CC | BB |
| (3) Gel time (sec) | 17 | 32 | 16 | 18 | 15 | 28 | 18 | 15 | 16 |
| (4) Bond strength (g/cm) | 1430 | 1320 | 1010 | 950 | 1020 | 1060 | 760 | 280 | 920 |
| (5) Void | AA | AA | AA | AA | AA | AA | CC | BB | AA |
| (6) Bubbles generation | AA | AA | AA | AA | BB | BB | BB | AA | AA |
| (7) Electrical conductivity | | | | | | | | | |
| immediately after lamination | 5 Ω | 5 Ω | 5 Ω | 5 Ω | 5 Ω | 5 Ω | 10 Ω | 10 Ω | 5 Ω |
| after 600-hour storage at 60° C. and 95% RH | 5 Ω | 5 Ω | 5 Ω | 6 Ω | 5 Ω | 6 Ω | 16 Ω | 15 Ω | 8 Ω |
| (8) Wiring short-circuit | AA | AA | AA | AA | AA | AA | AA | AA | AA |
| (9) Repairability | AA | AA | AA | AA | AA | AA | CC | BB | CC |

Example 13

At room temperature, the epoxy resin (I): a bisphenol A epoxy resin, the phenolic curing agent (IIB): a phenol/p-xylylene glycoldimethylether polycondensate (MILEX LLL produced by Mitsui Chemicals, Inc.), the high-softening point fine particles (III): the high-softening point fine particles synthesized in Synthesis Example 1, the anti-foaming agent (V): the silicone elastomer (A) synthesized in Synthesis Example 3, and the coupling agent (VI): γ-glycidoxypropyltrimethoxysilane (KBM-403 produced by Shin-Etsu Silicones), were pre-kneaded by means of a Dalton's mixer and then kneaded with a three-roll mill. After the curing catalyst (VII): an imidazole-modified microcapsuled compound (NOVACURE HX3748 produced by Asahi Kasei Epoxy Corporation) was mixed with the kneaded product, the mixture was kneaded with a Dalton's mixer under vacuum and degassed. Amounts of the components added are shown in Table 5.

The paste for circuit connection thus obtained was evaluated by the aforesaid testing methods. The results are shown in Table 6.

Example 14

A paste for circuit connection was prepared and evaluated in the same manner as in Example 13, except that the curing catalyst (VII) was not used and the other components were used in amounts as shown in Table 5. The results are shown in Table 6.

Example 15

A paste for circuit connection was prepared and evaluated in the same manner as in Example 13, except that the curing catalyst (VII) was not used, the anti-foaming agent (V) was changed from the silicone elastomer (A) to linear silicone B (DC3037 produced by Shin-Etsu Silicones), and the other components were used in amounts as shown in Table 5. The results are shown in Table 6.

Example 16

A paste for circuit connection was prepared and evaluated in the same manner as in Example 13, except that the anti-foaming agent (V) was not used and the other components were used in amounts as shown in Table 5. The results are shown in Table 6.

Example 17

A paste for circuit connection was prepared and evaluated in the same manner as in Example 13, except that the coupling agent (VI) was not used and the other components were used in amounts as shown in Table 5. The results are shown in Table 6.

Example 18

A paste for circuit connection was prepared and evaluated in the same manner as in Example 13, except that the coupling agent (VI) and the anti-foaming agent (V) were not used and the other components were used in amounts as shown in Table 5. The results are shown in Table 6.

Comparative Example 6

A paste for circuit connection was prepared and evaluated in the same manner as in Example 13, except that the high-softening point fine particles (III) were not used and the other components were used in amounts as shown in Table 5. The results are shown in Table 6.

Comparative Example 7

A paste for circuit connection was prepared and evaluated in the same manner as in Example 13, except that the high-softening point fine particles (III) were changed to the low-softening point fine particles synthesized in Synthesis Example 2 and the other components were used in amounts as shown in Table 5. The results are shown in Table 6.

As shown in Table 6, the pastes for circuit connection of Examples 13 to 18 were favorably evaluated by the tests.

TABLE 5

| Composition (parts by weight) | Example | | | | | | Comparative Example | |
|---|---|---|---|---|---|---|---|---|
| | 13 | 14 | 15 | 16 | 17 | 18 | 6 | 7 |
| (I) Epoxy resin | 53 | 55 | 55 | 55 | 53 | 55 | 58 | 52 |
| (IIB) Phenolic curing agent | 17 | 19 | 19 | 19 | 18 | 20 | 22 | 15 |
| (III) High-softening point fine particles | 15 | 15 | 15 | 21 | 15 | 21 | — | — |
| Low-softening point fine particles | — | — | — | — | — | — | — | 15 |
| (V) Anti-foaming agent | | | | | | | | |
| Silicone A | 10 | 10 | — | — | 10 | — | 15 | 13 |
| Silicone B | — | — | 10 | — | — | — | — | — |
| (VI) Coupling agent | 1 | 1 | 1 | 1 | — | — | 1 | 1 |
| (VII) Curing catalyst | 4 | — | — | 4 | 4 | 4 | 4 | 4 |
| Total | 100 | 100 | 100 | 100 | 100 | 100 | 100 | 100 |

Phenolic curing agent: MILEX LLL (Mitsui Chemicals, Inc.)
High-softening point fine particles: softening temperature= 80° C.
Low-softening point fine particles: softening temperature= 40° C.
Silicone A: silicone elastomer (A)
Silicone B: linear silicone DC3037 (Shin-Etsu Silicones)
Curing catalyst: imidazole-modified microcapsuled compound

TABLE 6

| Evaluation Item | Example | | | | | | Comparative Example | |
|---|---|---|---|---|---|---|---|---|
| | 13 | 14 | 15 | 16 | 17 | 18 | 6 | 7 |
| (1) Storage stability | AA | AA | AA | AA | AA | AA | AA | CC |
| (2) Application properties | AA | AA | AA | AA | AA | AA | AA | CC |
| (3) Gel time (sec) | 14 | 27 | 26 | 12 | 14 | 12 | 14 | 13 |
| (4) Bond strength (g/cm) | 1350 | 1250 | 960 | 980 | 880 | 920 | 660 | 320 |
| (5) Void | AA | AA | AA | AA | AA | AA | CC | BB |
| (6) Bubbles generation | AA | AA | AA | BB | AA | BB | BB | AA |
| (7) Electrical conductivity | | | | | | | | |
| immediately after lamination | 10 Ω | 10 Ω | 10 Ω | 10 Ω | 10 Ω | 10 Ω | 10 Ω | 18 Ω |
| after 600-hour storage at 60° C. and 95% RH | 10 Ω | 10 Ω | 11 Ω | 10 Ω | 10 Ω | 11 Ω | 18 Ω | 35 Ω |
| (8) Wiring short-circuit | AA | AA | AA | AA | AA | AA | AA | AA |
| (9) Repairability | AA | AA | AA | AA | AA | AA | CC | BB |

Example 19

At room temperature, the epoxy resin (I): a bisphenol A epoxy resin, the phenolic curing agent (IIB): a phenol/p-xylylene glycoldimethylether polycondensate (MILEX LLL produced by Mitsui Chemicals, Inc.), the high-softening point fine particles (III): the high-softening point fine particles synthesized in Synthesis Example 1, the anti-foaming agent (V): the silicone elastomer (A) synthesized in Synthesis Example 3, and the coupling agent (VI): γ-glycidoxypropyltrimethoxysilane (KBM-403 produced by Shin-Etsu Silicones), were pre-kneaded by means of a Dalton's mixer and then kneaded with a three-roll mill. After the conductive particles (IV): Micropearl Au-205 (produced by Sekisui Chemical Co., Ltd; specific gravity 2.67) and the curing catalyst (VII): an imidazole-modified microcapsuled compound (NOVACURE HX3748 produced by Asahi Kasei Epoxy Corporation) were mixed with the kneaded product, the mixture was kneaded with a Dalton's mixer under vacuum and degassed. Amounts of the components added are shown in Table 7.

The anisotropic conductive paste thus obtained was evaluated by the aforesaid testing methods. The results are shown in Table 8.

Example 20

An anisotropic conductive paste was prepared and evaluated in the same manner as in Example 19, except that the curing catalyst (VII) was not used and the other components were used in amounts as shown in Table 7. The results are shown in Table 8.

Example 21

An anisotropic conductive paste was prepared and evaluated in the same manner as in Example 19, except that the anti-foaming agent (V) was changed from the silicone elastomer (A) to linear silicone B (DC3037 produced by Shin-Etsu Silicones) and the other components were used in amounts as shown in Table 7. The results are shown in Table 8.

Example 22

An anisotropic conductive paste was prepared and evaluated in the same manner as in Example 19, except that the coupling agent (VI) was not used and the other components were used in amounts as shown in Table 7. The results are shown in Table 8.

Example 23

An anisotropic conductive paste was prepared and evaluated in the same manner as in Example 19, except that the coupling agent (VI) and the anti-foaming agent (V) were not used and the other components were used in amounts as shown in Table 7. The results are shown in Table 8.

Example 24

An anisotropic conductive paste was prepared and evaluated in the same manner as in Example 19, except that the coupling agent (VI), the anti-foaming agent (V) and the curing catalyst (VII) were not used and the other components were used in amounts as shown in Table 7. The results are shown in Table 8.

Comparative Example 8

An anisotropic conductive paste was prepared and evaluated in the same manner as in Example 19, except that the high-softening point fine particles (III) were not used and the other components were used in amounts as shown in Table 7. The results are shown in Table 8.

Comparative Example 9

An anisotropic conductive paste was prepared and evaluated in the same manner as in Example 19, except that the high-softening point fine particles (III) were changed to the low-softening point fine particles synthesized in Synthesis Example 2 and the other components were used in amounts as shown in Table 7. The results are shown in Table 8.

Comparative Example 10

An anisotropic conductive paste was prepared and evaluated in the same manner as in Example 19, except that the components were used in amounts as shown in Table 7. The results are shown in Table 8.

As shown in Table 8, the anisotropic conductive pastes of Examples 19 to 24 were favorably evaluated by the tests.

TABLE 7

| Composition | Example | | | | | | Comparative Example | | |
|---|---|---|---|---|---|---|---|---|---|
| (parts by weight) | 19 | 20 | 21 | 22 | 23 | 24 | 8 | 9 | 10 |
| (I) Epoxy resin | 49 | 52 | 49 | 50 | 53 | 55 | 55 | 49 | 27 |
| (IIB) Phenolic curing agent | 15 | 17 | 15 | 15 | 17 | 20 | 19 | 15 | 51 |
| (III) High-softening point fine particles | 15 | 15 | 15 | 15 | 20 | 20 | — | — | 8 |
| Low-softening point fine particles | — | — | — | — | — | — | — | 15 | — |
| (IV) Conductive particles | 5 | 5 | 5 | 5 | 5 | 5 | 5 | 5 | 5 |
| (V) Anti-foaming agent | | | | | | | | | |
| Silicone A | 10 | 10 | — | 10 | — | — | 15 | 10 | 3 |
| Silicone B | — | — | 10 | — | — | — | — | — | — |
| (VI) Coupling agent | 1 | 1 | 1 | — | — | — | 1 | 1 | 1 |
| (VII) Curing catalyst | 5 | — | 5 | 5 | 5 | — | 5 | 5 | 5 |
| Total | 100 | 100 | 100 | 100 | 100 | 100 | 100 | 100 | 100 |

Phenolic curing agent: MILEX LLL (Mitsui Chemicals, Inc.)
High-softening point fine particles: softening temperature= 80° C.
Low-softening point fine particles: softening temperature= 40° C.
Silicone A: silicone elastomer (A)
Silicone B: linear silicone DC3037 (Shin-Etsu Silicones)
Curing catalyst: imidazole-modified microcapsuled compound

TABLE 8

| | Example | | | | | | Comparative Example | | |
|---|---|---|---|---|---|---|---|---|---|
| Evaluation Item | 19 | 20 | 21 | 22 | 23 | 24 | 8 | 9 | 10 |
| (1) Storage stability | AA | AA | AA | AA | AA | AA | AA | CC | BB |
| (2) Application properties | AA | AA | AA | AA | AA | AA | AA | CC | BB |
| (3) Gel time (sec) | 14 | 27 | 12 | 10 | 12 | 23 | 14 | 12 | 9 |
| (4) Bond strength (g/cm) | 1350 | 1250 | 980 | 880 | 920 | 950 | 660 | 320 | 890 |
| (5) Void | AA | AA | AA | AA | AA | AA | CC | BB | AA |
| (6) Bubbles generation | AA | AA | AA | AA | BB | BB | BB | AA | AA |
| (7) Electrical conductivity | | | | | | | | | |
| immediately after lamination | 5 Ω | 5 Ω | 5 Ω | 5 Ω | 5 Ω | 5 Ω | 10 Ω | 10 Ω | 5 Ω |
| after 600-hour storage at 60° C. and 95% RH | 5 Ω | 5 Ω | 5 Ω | 8 Ω | 7 Ω | 9 Ω | 18 Ω | 16 Ω | 7 Ω |
| (8) Wiring short-circuit | AA | AA | AA | AA | AA | AA | AA | AA | AA |
| (9) Repairability | AA | AA | AA | AA | AA | AA | CC | BB | CC |

Effect of the Invention

The present invention provides pastes for circuit connection and anisotropic conductive pastes that are excellent in storage stability and dispenser application workability.

The pastes for circuit connection and the anisotropic conductive pastes according to the present invention can be free of voids, bubbles and bleeding when used in connection of wirings under such severe thermocompression bonding conditions as a temperature of 200° C. and a time of 10 to 30 seconds to assure high productivity. Cured products of the pastes ensure high bonding and connection reliabilities even at high temperatures and high humidity, and also have high repairability.

What is claimed is:

1. A method which comprises connecting a first electric circuit wiring formed on a substrate to a second electric circuit wiring formed on a substrate by applying a paste thereto, the paste consisting of:

(I) 30 to 80% by mass of an epoxy resin, (II) 10 to 50% by mass of a curing agent selected from the group consisting of an acid anhydride curing agent (IIA) and a phenolic curing agent (IIB), and (III) 5 to 25% by mass of high-softening point fine particles.

2. A method which comprises connecting a first electric circuit wiring formed on a substrate to a second electric circuit wiring formed on a substrate by applying a paste thereto, the paste consisting of:
(I) 30 to 79.9% by mass of an epoxy resin,
(II) 10 to 50% by mass of a curing agent selected from the group consisting of an acid anhydride curing agent (IIA) and a phenolic curing agent (IIB),
(III) 5 to 25% by mass of high-softening point fine particles, and
(V) 0.1 to 20% by mass of an anti-foaming agent.

3. A method which comprises connecting a first electric circuit wiring formed on a substrate to a second electric circuit wiring formed on a substrate by applying a paste thereto, the paste consisting of:
(I) 30 to 79.8% by mass of an epoxy resin,
(II) 10 to 50% by mass of a curing agent selected from the group consisting of an acid anhydride curing agent (IIA) and a phenolic curing agent (IIB),
(III) 5 to 25% by mass of high-softening point fine particles, and
(VI) 0.1 to 5% by mass of a coupling agent.

4. A method which comprises connecting a first electric circuit wiring formed on a substrate to a second electric circuit wiring formed on a substrate by applying a paste thereto, the paste consisting of:
(I) 30 to 79.8% by mass of an epoxy resin,
(II) 10 to 50% by mass of a curing agent selected from the group consisting of an acid anhydride curing agent (IIA) and a phenolic curing agent (IIB),
(III) 5 to 25% by mass of high-softening point fine particles,
(V) 0.1 to 20% by mass of an anti-foaming agent, and
(VI) 0.1 to 5% by mass of a coupling agent.

5. An anisotropic conductive paste consisting of:
(I) 30 to 80% by mass of an epoxy resin,
(II) 10 to 50% by mass of a curing agent selected from the group consisting of an acid anhydride curing agent (IIA) and a phenolic curing agent (IIB),
(III) 5 to 25% by mass of high-softening point fine particles, and
(IV) 0.1 to 25% by mass of conductive particles.

6. An anisotropic conductive paste consisting of:
(I) 30 to 79.9% by mass of an epoxy resin,
(II) 10 to 50% by mass of a curing agent selected from the group consisting of an acid anhydride curing agent (IIA) and a phenolic curing agent (IIB),
(III) 5 to 25% by mass of high-softening point fine particles,
(IV) 0.1 to 25% by mass of conductive particles, and
(V) 0.1 to 20% by mass of an anti-foaming agent.

7. An anisotropic conductive paste consisting of:
(I) 30 to 79.8% by mass of an epoxy resin,
(II) 10 to 50% by mass of a curing agent selected from the group consisting of an acid anhydride curing agent (IIA) and a phenolic curing agent (IIB),
(III) 5 to 25% by mass of high-softening point fine particles,
(IV) 0.1 to 25% by mass of conductive particles, and
(VI) 0.1 to 5% by mass of a coupling agent.

8. An anisotropic conductive paste consisting of:
(I) 30 to 79.8% by mass of an epoxy resin,
(II) 10 to 50% by mass of a curing agent selected from an acid anhydride curing agent (IIA) and a phenolic curing agent (IIB),
(III) 5 to 25% by mass of high-softening point fine particles,
(IV) 0.1 to 25% by mass of conductive particles,
(V) 0.1 to 20% by mass of an anti-foaming agent, and
(VI) 0.1 to 5% by mass of a coupling agent.

9. The method according to claim 1, wherein the paste further consists of a curing catalyst (VII).

10. The method according to claim 1, wherein the epoxy resin (I) has at least 1 to 6 epoxy groups on average per molecule and an average molecular weight of 100 to 7000 in terms of polystyrene according to GPC.

11. The method according to claim 1, wherein the acid anhydride curing agent (IIA) is a phthalic acid or maleic acid derivative.

12. The method according to claim 1, wherein the phenolic curing agent (IIB) is a phenolic novolak curing agent.

13. The method according to claim 1, wherein the high-softening point fine particles (III) have a softening temperature of 60 to 150° C. and a primary particle size of 0.01 to 2 μm.

14. The method according to claim 1, wherein the high-softening point fine particles (III) are obtained by copolymerization of methyl (meth)acrylate and a copolymerizable monomer other than methyl (meth)acrylate and contain the methyl (meth)acrylate at 30 to 70% by mass.

15. The anisotropic conductive paste according to claim 5, wherein a surface of the conductive particles (IV) comprises old or nickel.

16. A paste for circuit connection consisting of:
(I) 30 to 79.9% by mass of an epoxy resin,
(II) 10 to 50% by mass of a curing agent selected from the group consisting of an acid anhydride curing agent (IIA) and a phenolic curin, agent (IIB),
(III) 5 to 25% by mass of high-softening point fine particles, and
(V) 0.1 to 20% by mass of an anti-foaming agent, wherein the anti-foaming agent (V) is a polysilicone.

17. The paste for circuit connection according to claim 16, wherein the polysilicone is a silicone-modified elastomer having a softening temperature of −80 to 0° C. and existing in the paste as particles with a primary particle size of 0.05 to 5 μm.

18. A method comprising connecting an electric circuit wiring formed on a substrate with an electric circuit wiring formed on another substrate with the paste of claim 5.

19. The method according to claim 1, applied to any one kind of circuit materials, liquid crystal displays, organic electroluminescence displays, plasma displays, charge coupled devices or semiconductor devices.

20. The paste according to claim 8, further consists of: a curing catalyst (VII).

21. The paste according to claim 8, wherein the epoxy resin (I) has at least 1 to 6 epoxy groups on average per molecule and an average molecular weight of 100 to 7000 in terms of polystyrene according to GPC.

22. The paste according to claim 8, wherein the high-softening point fine particles (III) have a softening temperature of 60 to 150° C. and a primary particle size of 0.01 to 2 μm.

23. The paste according to claim 8, wherein the high-softening point fine particles (III) are obtained by copolymerization of methyl (meth)acrylate and a copolymerizable monomer other than methyl (meth)acrylate and contain the methyl (meth)acrylate at 30 to 70% by mass.

24. The paste according to claim 8, wherein a surface of the conductive particles (IV) comprises gold or nickel.

25. The paste according to claim 8, wherein the antifoaming agent (V) is a polysilicone.

26. The paste according to claim 8, having a viscosity at 25° C. of 30 to 400 Pa·s.

27. A method comprising connecting an electric circuit wiring formed on a substrate with an electric circuit wiring formed on another substrate with the paste of claim 8.

28. A method of using the paste of claim 8, applied to any one kind of circuit materials, liquid crystal displays, organic electroluminescence displays, plasma displays, charge coupled devices or semiconductor devices.

29. The paste according to claim 17, wherein the silicone-modified elastomer is an elastomer obtained by grafting a silicone-containing group to an epoxy resin.

30. A paste for circuit connection consisting of:
- (I) 30 to 80% by mass of an epoxy resin,
- (II) 10 to 50% by mass of a curing agent selected from the group consisting of an acid anhydride curing agent (IIA) and a phenolic curing agent (IIB), and
- (III) 5 to 25% by mass of high-softening point fine particles, wherein the paste has a viscosity at 25° C. of 30 to 400 Pa·s.

* * * * *

UNITED STATES PATENT AND TRADEMARK OFFICE
CERTIFICATE OF CORRECTION

PATENT NO. : 6,939,431 B2
DATED : September 6, 2005
INVENTOR(S) : Yasushi Mizuta et al.

It is certified that error appears in the above-identified patent and that said Letters Patent is hereby corrected as shown below:

Title page,
Item [56], References Cited, FOREIGN PATENT DOCUMENTS, change "WO 00/600055 A1" to -- WO 00/60005 A1 --.

Signed and Sealed this

Seventh Day of February, 2006

JON W. DUDAS
*Director of the United States Patent and Trademark Office*